United States Patent [19]
Ackley et al.

[11] Patent Number: 5,710,441
[45] Date of Patent: Jan. 20, 1998

[54] MICROCAVITY LED WITH PHOTON RECYCLING

[75] Inventors: Donald E. Ackley, Lambertville, N.J.; Chan-Long Shieh, Paradise Valley; Michael S. Lebby, Apache Junction, both of Ariz.

[73] Assignee: Motorola, Inc., Schaumburg, Ill.

[21] Appl. No.: 550,147

[22] Filed: Oct. 30, 1995

[51] Int. Cl.$^6$ .................. H01L 33/00; H01S 3/19; H01S 3/08

[52] U.S. Cl. .................. 257/98; 257/14; 257/79; 257/97; 257/183; 257/773; 257/774; 372/49; 372/99

[58] Field of Search .................. 257/13, 14, 79, 257/94, 96, 97, 98, 183, 773, 774; 372/44, 49, 92, 99

[56] References Cited

U.S. PATENT DOCUMENTS

| | | | |
|---|---|---|---|
| 4,970,566 | 11/1990 | Mendelhall | 357/30 |
| 5,055,893 | 10/1991 | Sasagawa | 257/94 |
| 5,162,878 | 11/1992 | Sasagawa et al. | 257/98 |
| 5,358,880 | 10/1994 | Lebby et al. | 437/23 |

FOREIGN PATENT DOCUMENTS

| | | | |
|---|---|---|---|
| 1-264275 | 10/1989 | Japan | 257/97 |
| 6-151955 | 5/1994 | Japan | 257/98 |

OTHER PUBLICATIONS

Gourley et al., "A Different Mirror", IEEE Spectrum, Aug. 1994, pp. 31–33, 36, 37.

*Primary Examiner*—Mahshid D. Saadat
*Assistant Examiner*—Alice W. Tang
*Attorney, Agent, or Firm*—Eugene A. Parsons

[57] ABSTRACT

A microcavity LED with photon recycling including a substrate having at least one layer of material positioned thereon, and a first cladding layer, a second cladding layer and an active region sandwiched therebetween forming a mesa on the layer of material. The mesa has generally vertical sides and an upper surface with an electrically conductive and light reflective system positioned on the vertical sides of the mesa and partially covering the upper surface to form a first electrical contact for the LED, the electrically conductive and light reflective system defining a centrally located light emitting opening on the surface of the mesa, the mesa having a diametric dimension of the surface greater than one time larger than a diametric dimension of the opening.

19 Claims, 1 Drawing Sheet

MICROCAVITY LED WITH PHOTON RECYCLING

BACKGROUND OF THE INVENTION

1. Field of the Invention

This invention relates to light emitting diodes (LED) and more specifically to a LED with improved light emission and efficiency.

2. Prior Art

The efficiency of a LED is limited by the total internal reflection because the index of refraction of the semiconductor material making up the LED (typically 3–3.5) is much higher than the index of refraction of the air (1) into which the light is emitted. Light distribution external to a LED is generally referred to as a Lambertian distribution, and corresponds to an omnidirectional distribution internal to the device. Because of this large spatial distribution of the generated light, only small amounts of the light can be effectively utilized, especially if the light is going to be coupled to a light conduction medium such as an optical fiber. In dealing with a Lambertian source, such as a LED, there are many ways available today to provide a method to increase the light coupling from the LED to the fiber core. For example, spherical lenses, microlenses, gradient index lenses (GRIN), diffraction gratings all are utilized successfully. Unfortunately, none of these techniques actually increases the amount of light generated for the same input current.

Increased efficiency implies less current and, therefore, less power to couple the same amount of light to a system. A more efficient LED provides higher optical coupling and less stringent specifications on the coupling designs and procedures, which results in less expensive and more manufacturable systems. These reasons imply that if the efficiency of a LED can be increased then the device will become more useful in applied technology.

One method to improve the external efficiency of an LED is to utilize reflectors on all sides of the LED except the light emitting side as disclosed in U.S. Pat. No. 5,358,880, entitled Method of Manufacturing Closed Cavity LED, issued 25 Oct., 1994 and assigned to the same assignee. In this manner, generated photons are directed in a single general direction. While increasing the efficiency of an LED, photons propagated in or near the plane of the device will be emitted at an oblique angle. The emission angle of these photons prevents their acceptance by a coupling to an optical system.

Currently, LEDs require large drive currents to generate enough light so that a reasonable amount of light couples to an optical fiber. With improved efficiencies, less current is required and, therefore, less heat is generated. Thus, a LED with improved efficiency results in greater applicability of the LED for commercial use.

It would be highly advantageous, therefore, to remedy the foregoing and other deficiencies inherent in the prior art.

Accordingly, it is an object of the present invention to provide improvements in LEDs.

Another object of the invention is to provide an LED with improved light emitting characteristics and improved efficiency.

And another object of the invention is to provide a LED with reduced output angle of photons for improved optical coupling.

SUMMARY OF THE INVENTION

Briefly, to achieve the desired objects of the instant invention in accordance with a preferred embodiment thereof, provided is a microcavity LED with photon recycling including a substrate having at least one layer of semiconductor material positioned thereon, a first cladding layer of a first conductivity type positioned on the layer of material, an active region positioned on the first cladding region, a second cladding layer of a second conductivity type positioned on the active region, the first cladding layer, the active region and the second cladding layer forming a mesa on the layer of material, the mesa having generally vertical sides and an upper surface, and an electrically conductive and light reflective system positioned on a layer of dielectric material and partially covering the upper surface to form a first electrical contact for the LED, the electrically conductive and light reflective system defining a centrally located light emitting opening on the surface of the mesa, the mesa having a diametric dimension on the surface in the range of 2 to 10 times larger than a diametric dimension of the opening.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE PREFERRED EMBODIMENTS

Figure 1:
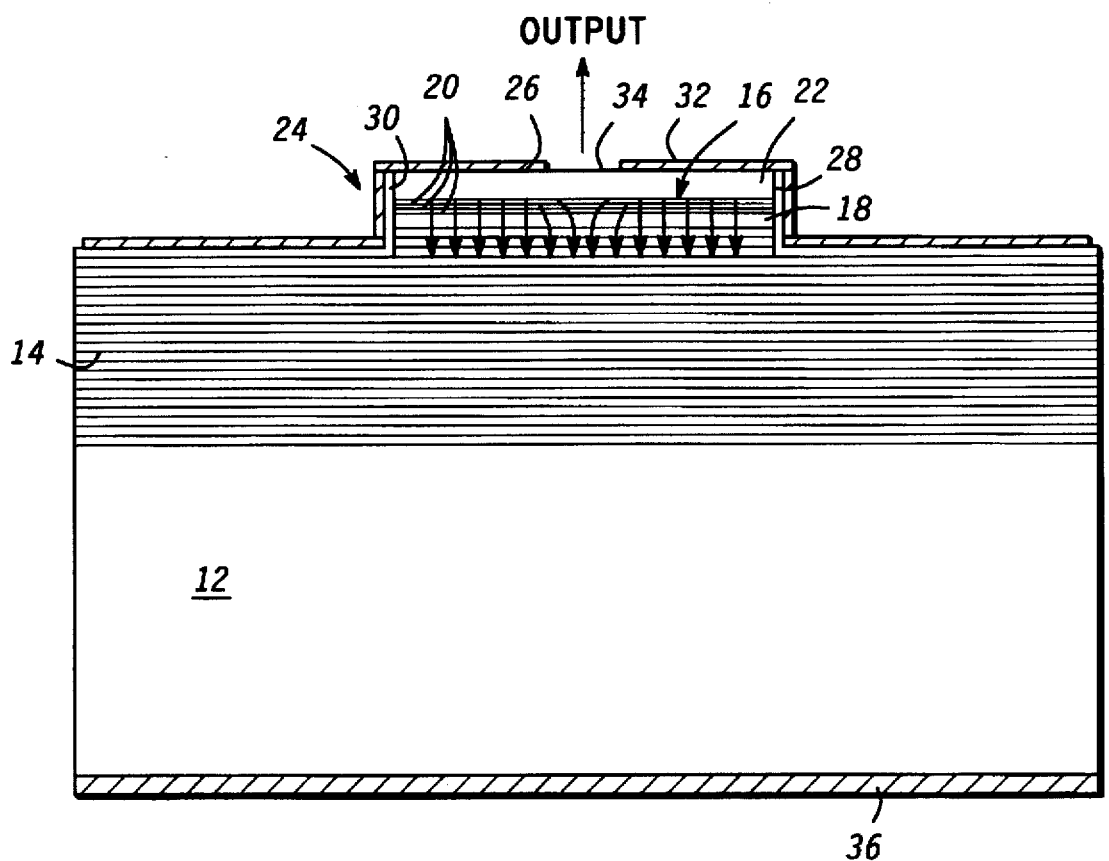
FIG. 1 is a sectional side view of an LED constructed in accordance with the teachings of the present invention.

Turning now to the drawings in which like reference characters indicate corresponding elements throughout the several views, attention is first directed to FIG. 1, which illustrates a LED generally designated 10. The device of the present invention consists of at least one layer, in this embodiment a plurality of layers, formed on a substrate 12 of a suitable material. Generally, the various layers are formed by epitaxial deposition accomplished by well known techniques in the art such as MBE, MOCVD, CBE, or the like. These techniques enable epitaxial depositions of relatively thin and thick layers of materials such as gallium arsenide, aluminum gallium arsenide, aluminum arsenide, silicon, indium gallium arsenide, etc.

Generally, substrate 12 is gallium arsenide (GaAs) or the like which, as will be understood presently, is compatible with layers subsequently grown thereon. A mirror stack 14 of Bragg mirrors having a first conductivity type, which in this specific embodiment is n-type conductivity, is grown on an upper surface of substrate 12. It should be understood that an intermediate layer or layers, such as a buffer layer, could be included as a portion of substrate 12. Mirror stack 14 is generally formed, for example, by epitaxially growing a plurality of pairs of layers of semiconductor material with alternating indexes of refraction on substrate 12. Each pair of alternating layers are grown to a predetermined thickness (approximately one half wavelength at the operating frequency) and the number of pairs is chosen to provide as much reflectivity of light as possible while limiting the stack to a practical number. In the preferred embodiment, approximately 30 pairs of layers are used for purposes described subsequently in the specification.

An active region 16 generally including one or more quantum wells separated by barrier layers is grown on mirror stack 14 with a spacer or cladding layer on either side thereof. The quantum wells, barrier layers and cladding layers are grown epitaxially. The quantum wells produce photons (light) in accordance with a well known phenomenon when properly energized by electrical current applied thereacross. In general, the greater the current applied to active region 16 the greater the number of photons generated.

In the preferred embodiment, a layer is deposited over mirror stack 14 and forms a cladding layer 18 of the first conductivity type in LED 10. Cladding layer 18 is lightly doped with an impurity to produce the first conductivity type. Three layers 20 of undoped material cooperate to provide active region 16 of LED 10. It should be understood that additional layers may be added to provide additional quantum wells as desired. A second cladding layer 22 is deposited on the upper surface of active region 16 and is lightly doped with an impurity to produce a second conductivity type. Layers 20 forming active region 16 and cladding layers 18 and 22 on either side thereof form the light generating portion of LED 10. Layers 18, 20 and 22 form what is commonly referred to as the cavity of the LED and is the light generating portion of LED 10. In the present embodiment of LED 10 the cavity is made very short, employing thin, lightly doped cladding layers, so that the internal free carrier loss is small, thereby increasing the efficiency. The formation of mirror stack 14 and active region 16 is well known in the art and will not be elaborated upon further in this disclosure.

Cladding layers 18 and 22 and active region 16 are formed into a mesa 24 on mirror stack 14 by conventional etching techniques. Mesa 24 has an upper surface 26 and substantially vertical sides 28. A dielectric layer 30 is deposited on the top surface of mirror stack 14 and vertical sides 28 of mesa 24. Dielectric layer 30 may be substantially any of the well known materials such as silicon nitride ($SiN_x$), and prevents electrical current from entering LED 10 from anywhere except the upper surface of mesa and causing a short in the LED.

A first metal contact layer 32 is deposited on the upper surface of cladding layer 22 and on dielectric layer 30 over vertical sides 28 and mirror stack 14. First metal contact layer 32 forms an ohmic contact with cladding layer 22. In this specific embodiment first metal contact layer 32 is formed of titanium tungsten (TiW) because it is convenient to deposit and is a p-type contact metal compatible with cladding layer 22. In this embodiment dielectric layer 30 and first metal contact layer 32 form an electrically conductive and light reflective system. However, in other applications the electrically conductive and light reflective system may include reflective material on the sides of the mesa and an electrically conductive and reflective material on the upper surface, or some other variations thereof.

First metal contact layer 32 is deposited over the entire upper surface and sides of LED 10 (on the outside of dielectric layer 30) except for a light emitting opening 34 centrally located on upper surface 26. First metal contact layer 32 and mirror stack 14 form a reflective cavity to reflect light (photons) in all directions until they exit through light emitting opening 34. Light emitting opening 34 restricts the photon emission angle resulting in the emission of photons which increases the coupling efficiency of the LED. Light emitting opening 34 is significantly smaller than the upper surface of mesa 24, with upper surface of mesa 24 having a diametric dimension 2–10 times larger than the diametric dimension of light emitting opening 34. Adjusting the relative sizes of light emitting opening 34 and size of mesa 24 (upper surface and depth) allows adjustment of the average number of recycling events and hence the photon lifetime of the device. Also, because a greater area of the upper mesa surface is contacted by first metal contact layer 32, better electrical contact is provided and better current distribution in the LED is realized.

A second contact layer 36 is deposited on the lower surface of substrate 12. Second contact layer 36 is shown as a n-type metal, and is the opposing contact to First metal contact layer 32. Current passed between first metal contact layer 32 and second contact layer 36 generates photons within active region 16 as described previously. It will be understood that second contact layer 36 may be positioned in different locations as desired, such as between substrate 12 and mirror stack 14. Since second contact layer 36 need not have light reflective characteristics, it may be a highly doped semiconductor material instead of metal.

Figure 2:
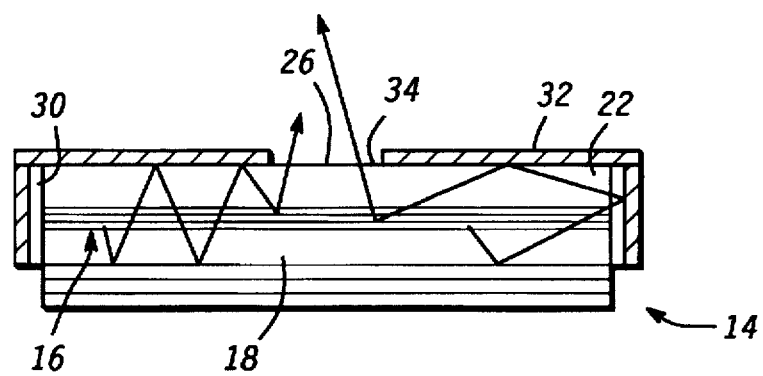
FIG. 2 is an enlarged sectional view of a portion of the LED illustrated in FIG. 1, illustrating photon recycling.

In operation, photons are generated by recombination of carriers injected into active region 16. Many of the photons traveling perpendicular to the surface of substrate 12 can couple efficiently into the optical mode defined by mirror stack 14 and first metal contact layer 32. In other words, photons which are generally perpendicular to substrate 12 and which are centrally generated, will be emitted through light emitting opening 34. Photons which are generated at an angle or which are not generated centrally will be reflected back into active region 16 as shown in FIG. 2. The reflected photons are then absorbed into active region 16 and re-emitted in a different direction in what is well known as the photon recycling process. This process continues until the photon is emitted through light emitting opening 34.

In order for the photon recycling process to work efficiently, free carrier absorption and scattering losses need to be minimized. This is achieved by making cladding layers 18 and 22 thin and only lightly doped as described previously, and by using enough mirror pairs in mirror stack 14 so that the acceptance angle for high reflectivity is large. In the preferred embodiment, approximately 30 mirror pairs are employed, providing reflectivity of >>99% for all incident angles <16 degrees. Thus provided is an LED with high efficiency and with a photon output angle which increases coupling to optical systems, further increases the apparent efficiency.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A microcavity LED with photon recycling comprising:
   a substrate having at least one layer of material positioned thereon;
   a first cladding layer of a first conductivity type positioned on the layer of material;
   an active region positioned on the first cladding layer;
   a second cladding layer of a second conductivity type positioned on the active region;
   the first cladding layer, the active region and the second cladding layer forming a mesa on the layer of material, the mesa having generally vertical sides and an upper surface; and
   an electrically conductive and light reflective system positioned on the vertical sides of the mesa and partially covering the upper surface to form a first electrical contact for the LED, the electrically conductive and light reflective system defining a centrally located light emitting opening on the upper surface of the mesa, the mesa having a diametric dimension of the surface greater than one time larger than a diametric dimension of the opening.

2. A microcavity LED with photon recycling as claimed in claim 1 wherein diametric diameter of the surface of the mesa is in the range of 2 to 10 times larger than the diametric dimension of the light emitting opening.

3. A microcavity LED with photon recycling as claimed in claim 1 wherein the electrically conductive and light reflective system includes a dielectric layer deposited on the vertical sidewalls of the mesa, and a first metal contact layer deposited on the dielectric layer and on the upper surface of the mesa to form the first electrical contact.

4. A microcavity LED with photon recycling as claimed in claim 3 wherein the cladding layers are thin and lightly doped to reduce internal free carrier loss.

5. A microcavity LED with photon recycling as claimed in claim 4 wherein the active region includes a plurality of quantum well layers separated by barrier layers.

6. A microcavity LED with photon recycling as claimed in claim 1 wherein the at least one layer of material includes a mirror stack.

7. A microcavity LED with photon recycling as claimed in claim 6 wherein the mirror stack includes approximately thirty pairs of layers.

8. A microcavity LED with photon recycling as claimed in claim 7 wherein the thirty pairs of layers each include layers of AlGaAs.

9. A microcavity LED with photon recycling as claimed in claim 8 wherein the thirty pairs of layers each include layers of different amounts of aluminum to provide different indexes of refraction.

10. A microcavity LED with photon recycling comprising:

a substrate having at least one layer of material positioned thereon;

a first cladding layer of a first conductivity type positioned on the layer of material;

an active region positioned on the first cladding layer;

a second cladding layer of a second conductivity type positioned on the active region;

the first cladding layer, the active region and the second cladding layer forming a mesa on the at least one layer of material, the mesa having generally vertical sides and an upper surface;

a layer of dielectric material positioned on the vertical sides of the mesa; and an electrically conductive and light reflective layer positioned on the layer of dielectric material and partially covering the upper surface to form a first electrical contact for the LED, the electrically conductive layer defining a centrally located light emitting opening on the upper surface of the mesa, the mesa having a diametric dimension of the surface greater than one time larger than a diametric dimension of the opening.

11. A microcavity LED with photon recycling as claimed in claim 10 wherein the diametric dimension of the surface of the mesa is in the range of 2 to 10 times larger than the diametric dimension of the light emitting opening.

12. A microcavity LED with photon recycling as claimed in claim 10 wherein the at least one layer of material includes a mirror stack.

13. A microcavity LED with photon recycling as claimed in claim 12 wherein the mirror stack includes approximately thirty pairs of layers.

14. A microcavity LED with photon recycling as claimed in claim 13 wherein the thirty pairs of layers each include layers of AlGaAs.

15. A microcavity LED with photon recycling as claimed in claim 14 wherein the thirty pairs of layers each include layers of different amounts of aluminum to provide different indexes of refraction.

16. A microcavity LED with photon recycling comprising:

a substrate;

a mirror stack positioned on the substrate;

a first cladding layer of a first conductivity type positioned on a mirror stack;

an active region positioned on the first cladding region;

a second cladding layer of a second conductivity type positioned on the active layer;

the first cladding layer, the active region and the second cladding layer forming a mesa on the mirror stack, the mesa having generally vertical sides and an upper surface;

a layer of dielectric material positioned on the vertical sides of the mesa; and an electrically conductive and light reflective layer positioned on the layer of dielectric material and partially covering the upper surface to form a first electrical contact for the LED, the electrically conductive layer defining a centrally located light emitting opening on the upper surface of the mesa, the surface of the mesa having a diametric dimension in the range of 2 to 10 times larger than a diametric dimension of the opening.

17. A microcavity LED with photon recycling as claimed in claim 16 wherein the mirror stack includes approximately thirty pairs of layers.

18. A microcavity LED with photon recycling as claimed in claim 17 wherein the thirty pairs of layers each include layers of AlGaAs.

19. A microcavity LED with photon recycling as claimed in claim 18 wherein the thirty pairs of layers each include layers of different amounts of aluminum to provide different indexes of refraction.

* * * * *